(12) United States Patent
Weber et al.

(10) Patent No.: US 6,889,180 B1
(45) Date of Patent: May 3, 2005

(54) METHOD AND APPARATUS FOR A MONITOR THAT DETECTS AND REPORTS A STATUS EVENT TO A DATABASE

(75) Inventors: Laura A. Weber, Austin, TX (US); Fritz A. Boehm, Dripping Springs, TX (US); Jean Anne Booth, Austin, TX (US); Jeffrey S. Leonard, Austin, TX (US); Shawn D. Strawbridge, Austin, TX (US); Douglas N. Good, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 536 days.

(21) Appl. No.: 09/406,017

(22) Filed: Sep. 24, 1999

Related U.S. Application Data
(60) Provisional application No. 60/119,226, filed on Feb. 9, 1999.

(51) Int. Cl.$^7$ ............................................. G06F 17/50
(52) U.S. Cl. .............................. 703/16; 703/15; 716/18
(58) Field of Search ............................... 703/15; 716/18

(56) References Cited

U.S. PATENT DOCUMENTS

| | | | |
|---|---|---|---|
| 4,878,179 A | | 10/1989 | Larson et al. |
| 5,623,418 A | * | 4/1997 | Rostoker et al. ................ 716/1 |
| 5,706,476 A | * | 1/1998 | Giramma ...................... 703/15 |
| 5,867,399 A | * | 2/1999 | Rostoker et al. .............. 716/18 |
| 5,870,585 A | * | 2/1999 | Stapleton ..................... 703/15 |
| 5,933,356 A | * | 8/1999 | Rostoker et al. .............. 703/15 |
| 6,066,965 A | | 5/2000 | Blomgren et al. |
| 6,077,304 A | * | 6/2000 | Kasuya ........................ 703/14 |
| 6,289,497 B1 | | 9/2001 | Leight et al. |

OTHER PUBLICATIONS

Sunder Rajan, "Essential VHDL RTL Synthesis Done Right", Jun. 1998, Sundar Rajan and Gennis Piazza, pp. 13–23 and pp. 141–165.*
U. S. Patent Application entitled "Software Modeling of Logic Signals Capable of Holding More than Values;" Inventors: Blomgren, et al.; U.S. Appl. No. 09/405,618; filed Sep. 24, 1999.
U.S. Patent Application entitled "Multiple State Simulation for Non–Binary Logic;" Inventors: Blomgren, et al.; U.S. Appl. No. 09/405,474; filed Sep. 24, 1999.
U.S. Patent Application entitled "Method and Apparatus that Reports Multiple Status Events With a Single Monitor;" Inventors: Blomgren, et al.; U.S. Appl. No. 09/406,016; filed Sep. 24, 1999.

* cited by examiner

*Primary Examiner*—Kevin J. Teska
*Assistant Examiner*—Dwin M. Craig
(74) *Attorney, Agent, or Firm*—Matthew J. Booth & Associates, PLLC; Matthew J. Booth

(57) ABSTRACT

The present invention is a monitor that detects a design verification event and reports a status event to a database. One embodiment of the present invention comprises a monitor declaration, zero or more signal declarations, zero or more bus declarations and one or more logic expressions. A logic expression, formulated using the declared signals and buses, is used to evaluate whether a specific verification event has occurred. The present invention further comprises a monitor where the signal of the signal declaration of the monitor is an N-Nary signal. Additionally, the present invention comprises a parser to translate the monitor source file code into a standard computer language code.

20 Claims, 4 Drawing Sheets

| a1 b1 | a1 b2 | a1 b3 |
| --- | --- | --- |
| a2 b1 | a2 b2 | a2 b3 |
| a3 b1 | a3 b2 | a3 b3 |

METHOD AND APPARATUS FOR A MONITOR THAT DETECTS AND REPORTS A STATUS EVENT TO A DATABASE

This application claims the benefits of the earlier filed U.S. Provisional App. Ser. No. 60/119,226, filed 9 Feb. 1999 (9 Feb. 1999), which is incorporated by reference for all purposes into this application.

A portion of the disclosure of this patent document contains material that is subject to copyright protection. The copyright owner has no objection to the facsimile reproduction by anyone of the patent document or the patent disclosure, as the material appears in the Patent and Trademark Office patent file or records, but otherwise reserves all copyright rights whatsoever.

BACKGROUND OF THE INVENTION

1. Field of the Invention

The present invention relates to digital computing. More particularly, the present invention relates to a method and apparatus for one or more monitors that detects and reports a status event to a database. Additionally, the present invention relates to an apparatus and method that reports multiple status events to a database through a single program. Additionally, the present invention relates to a monitor language that describes status events using a plurality of keywords.

2. Description of the Related Art

A digital design performs a finite number of logical functions or operations. For instance, a typical digital design such as a microprocessor might support four separate operations called addition (a), multiplication (m), subtraction (s), and division (d). Within each operation, different specific events may occur. For instance, addition of two negative numbers may occur, or addition of two positive numbers may occur.

A digital design will support many combinations of events where each type of specific event is called a state. In more complex designs, events may happen serially so that the number of states is increased. For instance, the operation sequence addition-multiplication-division (amd) is a different state than the operation sequence addition-multiplication-subtraction (ams). More states exist in the digital design when each a, m, s, and d operation supports various types of operands (i.e., positive, negative, and zero). Each permutation combining possible specific events results in a different state.

Exhaustive verification of modern digital designs such as microprocessors is virtually impossible because such designs may attain an almost incalculable number of states. A designer must therefore determine a sub-list of states that represent the most interesting states. The sub-list of states should include functional events, which are events that can be defined based on the specification of the design, and implementation events, which are specific to how the designer chose to implement the specification. While the sub-list of interesting states is not exhaustive, it usually provides a yardstick for measuring test coverage. To gain an adequate level of confidence that the design is functioning correctly, it is necessary to verify whether the design attains all of these interesting states during operation or simulation.

Verification of digital designs is usually done using a simulator. A simulator is a program that runs the design file of a digital design in order to recreate how the design would perform on a computer chip. A common method for generating test stimulus is to use a random, or directed random, test case generator. With random test case generation, the correctness of the design being simulated is established by having the results predicted automatically by some sort of reference model. The actual checking may take many forms, ranging from comparing the final results in memory to checking internal state cycle-by-cycle. There are major advantages to using random test case generation. Computer programs can generate test cases much faster than people can, so many more design states can be reached in the same amount of time using random test case generation. This is critically important for complex designs which need a reasonable time-to-market. Also, by introducing randomness, the verification engineer can think of a general set of tests that would hit interesting states, and let the computer generate all the special cases. In many cases, the random test generator ends up creating situations that a tester may not have thought to create.

A drawback to random test case generation, however, is that it is difficult to know exactly what is being tested. Thus, it is difficult to gain an adequate level of confidence that the design is attaining all of the required states determined by the designer to be interesting. A number of approaches have been used to determine when a design has been sufficiently verified using random test case generation. One method is to use statistical data from previous designs to predict the expected bug rate. This requires that the statistical data exist for the same style of design and the same test generation tool. Another method is to simply try as many different test strategies with the random test generator as one can think of, and then run them until the bug rate decreases. A third method is to use coverage analysis tools to quantify what percentage of the existing design states have been hit.

Existing coverage analysis tools typically traverse the source code of the design to generate a list of unique states to be tracked. Since the resulting coverage data is based purely on the existing source code, the coverage data is very specific to the implementation of the design. There is no way to use the coverage data to evaluate functional coverage, or how much of the specification has been tested. It can also be difficult to evaluate how many of the cases that have not been hit are actually interesting. And finally, source-code generated coverage data can not include data on interesting combinations of events.

The present invention introduces a method for evaluating coverage from either a functional or an implementation perspective, including combinatorial coverage. It provides an easy way to write a software monitor to identify an event in a design and then log the information concerning attainment of the state into a database for further analysis. The analysis of the database will determine if adequate coverage is being performed on this list of events, and if not, the cause of the lack of coverage can be investigated. The list of events can be driven by the sub-list of events determined by the designer to be interesting.

The lists of interesting events in the test coverage of a design can, in some cases, be described by taking a cross product of some combination of events. For example, it is typically interesting to verify that the design has been tested where all combinations of two instructions have run back-to-back. Another example is to test all possible combinations of operands for an instruction. As designs are capable of executing more unique instructions with more types of operands, more interesting states can be expressed as a cross product of different events.

Supporting a new logic design style requires the invention of new coding techniques to verify the computer-aided design of the logic circuits and their constituent subcircuits. The N-nary logic design style is no exception. N-nary logic is a dynamic logic design style fully described in a copending patent application, U.S. patent application Ser. No. 09/019,355, filed 5 Feb. 1998 (5 Feb. 1998), now U.S. Pat. No. 6,066,965, and titled "Method and Apparatus for a N-Nary logic Circuit Using 1-of-4 Signals", which is incorporated by reference for all purposes and is referred to as "The N-nary Patent." The simulation of N-nary logic is fully described in the following copending patent applications: U.S. patent application Ser. No. 09/405,618, filed 24 Sep. 1999 (24 Sep. 1999), titled "Software Modeling of Logic Signals Capable of Holding More Than Two Values", and U.S. patent application Ser. No. 09/405,474, filed 24 Sep. 1999 (24 Sep. 1999), titled "Multiple-State Simulation for Non-Binary Logic", both of which are incorporated by reference for all purposes.

The N-nary logic family supports a variety of signal encodings, including 1-of-4. In 1-of-4 encoding, four wires are used to indicate one of four possible values. In contrast, traditional static logic design uses two wires to indicate four values, as is demonstrated in Table 1. In Table 1, the $A_0$ and $A_1$ wires are used to indicate the four possible values for operand A: 00, 01, 10, and 11. Table 1 also shows the decimal value of an encoded 1-of-4 signal corresponding to the two-bit operand value, and the methodology by which the value is encoded using four wires.

TABLE 1

| 2-bit operand value | | N-nary (1-of-4) Signal A Decimal Value | N-nary (1-of-4) Signal A 1-of-4 wires asserted | | | |
|---|---|---|---|---|---|---|
| $A_1$ | $A_0$ | A | A[3] | A[2] | A[1] | A[0] |
| 0 | 0 | 0 | 0 | 0 | 0 | 1 |
| 0 | 1 | 1 | 0 | 0 | 1 | 0 |
| 1 | 0 | 2 | 0 | 1 | 0 | 0 |
| 1 | 1 | 3 | 1 | 0 | 0 | 0 |

"Traditional" dual-rail dynamic logic also uses four wires to represent two bits, but the dual-rail scheme always requires two wires to be asserted. In contrast, as shown in Table 1, N-nary logic only requires assertion of one wire. The benefits of N-nary logic over dual-rail dynamic logic, such as reduced power and reduced noise, should be apparent from a reading of the N-nary Patent. All signals in N-nary logic, including 1-of-4, are of the 1-of-N form where N is any integer greater than one. A 1-of-4 signal requires four wires to encode four values (0–3 inclusive), or the equivalent of two bits of information. More than one wire will never be asserted for a valid 1-of-N signal. Similarly, N-nary logic requires that a high voltage be asserted on only one wire for all values, even the value for zero (0).

Any one N-nary logic gate may comprise multiple inputs and/or outputs. In such a case, a variety of different N-nary encodings may be employed. For instance, consider a gate that comprises two inputs and two outputs, where the inputs are a 1-of-4 signal and a 1-of-2 signal and the outputs comprise a 1-of-4 signal and a 1-of-3 signal. Variables such as P, Q, R, and S may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-nary signals that comprise a variety of different encodings.

The signal naming convention used in the present disclosure is fully described in a copending patent application, U.S. patent application Ser. No. 09/210,408, filed 11 Dec. 1998 (11 Dec. 1998), now U.S. Pat. No. 6,289,497, and titled "Method and Apparatus for N-nary Hardware Description Language", which is incorporated by reference for all purposes and is referred to as "The Hardware Description Patent."

The signal naming convention identifies certain information that characterizes the signal, specifically information concerning 1-of-N degree, evaluation, and clock phase. The naming convention indicates the 1-of-N degree for each gate signal. The character, H, h, L, or l, in the evaluation field conveys information concerning the evaluation direction and evaluation completeness of the signal. The characters "H" and "h" indicate evaluation on the rising edge, or high-going signals; the characters "L" and "l" indicate evaluation on the falling edge, or low-going signals. This signal convention allows the transistor synthesis tool described in the Hardware Description Patent to ensure that only high-going signals are used for connections between gates. The transistor synthesis tool uses low-going signals internally within cells.

The use of the upper- and lower-case of H and L designate the "evaluation completeness" of the named signal. To understand "evaluation completeness," a background discussion of N-nary signal characteristics may be helpful. A 1-of-N signal is a signal driven by a cell that evaluates for all possible legal combinations of input. The 1-of-N signal will, if it fails to evaluate, represent an invalid state. A 0-or-1-of-N signal is a signal driven by a cell that fails to evaluate for some legal input value. The 0-or-1-of-N signal will, if it fails to evaluate, represent a null value. This stems from the fact that, even for a value of zero, a 1-of-N signal must assert a positive voltage on one, and only one, wire of the N potential wires. Failure of a 0-or-1-of-N signal to assert a wire during an evaluation clock phase therefore results in a null value, rather than a value of zero. In the preferred embodiment of N-nary C, 1-of-N signals are indicated by the upper-case characters H and L in the evaluation field; 0-or-1-of-N signals are indicated by the lower-case characters h and l in the evaluation field.

The value of the clock phase field delivers information regarding the clock phase during which evaluation of the cell driving the signal evaluates. The minimum valid value for phase is 0 and the maximum is M−1, where M is the highest number of clock phases available to the circuit under design. The number of valid clock phases is a design specific variable, but may typically be between 3 and 6.

N-nary C also allows certain other optional information to be included in the name of a signal, including a description of the signal and bit number information. In the preferred embodiment, the signal description is set forth in the descriptor field and may comprise any number of lower-case alphanumeric characters, including the underscore "_" character. The contents of the bit field specify the bit column to which the gate being constructed belongs. Generally, in a data flow design, all the gates that operate on a given bit of data (e.g., "bit 4") are "floorplanned" such that the gates line up in a column (a "bit column"), facilitating orderly operation of the gates. The "floorplan" thus contains columns of related gates.

SUMMARY

The present invention comprises a method and apparatus for a monitor that detects and reports a status event to a database. A monitor checks a digital design such as a processor for specific verification events; if the monitor detects a specified event, it reports the information to a database. The monitor comprises a monitor declaration, zero or more signal declarations, zero or more bus declarations, and one or more logic expressions. A monitor declaration defines the name of the monitor. A logic expression, formulated using the declared signals and buses, is used to evaluate whether a specific verification event has occurred.

The present invention further comprises an apparatus and method that reports events to a database through a monitor where the signal of the signal declaration of the monitor is an N-Nary signal. In 1-of-N encoding, N wires are used to indicate one of N possible values. In addition, the present invention further comprises a parser to translate the code in the monitor source file into a code that uses a standard computer language. In one embodiment of the present invention, the parser translates the keywords of the monitor language into C++ routines (functions) that are executed by the simulator. Finally, the present invention further comprises a monitor where if the monitor detects the specific event for which it was looking, the monitor reports this information to a database.

Additionally, the present invention comprises a monitor language that describes events using a plurality of keywords. A keyword is a shorthand notation for one or more routines constructed in a standard programming language. A parser translates the monitor language into a standard programming language. The monitor language comprises groups of instructions, including a group of logic expressions, a group of declarations, e.g., bus and signal declarations, and a group comprising the functional language of the keywords.

Additionally, the present invention comprises a method and apparatus that reports multiple design verification events with a single monitor. A grid is a monitor that detects a cross product of multiple verification events and reports a single status event to a database. A grid comprises a monitor declaration, one or more axis declarations, zero or more signal declarations, zero or more bus declarations, one or more logic expressions, and a grid declaration. A monitor declaration defines the name of the monitor. An axis declaration defines the valid states for a functional attribute under test. If two or more axis declarations are declared, the multiple axes are used to produce a cross product of verification events. A logic expression, formulated using the declared signals and buses, is used to evaluate whether a specific verification event has occurred so that the grid can return a status event. A grid declaration returns the status event. The present invention further comprises embodiments where a grid uses a cross-product of verification events that comprises a fully populated cross-product of verification events or a sparsely populated cross-product of verification events.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus for a monitor that detects and reports a status event to a database. Additionally, the present invention comprises a method and apparatus that reports multiple status events with a single monitor. Additionally, the present invention relates to a monitor language that verifies a digital design using a plurality of keywords. And, the present invention comprises an apparatus and method that detects and reports verification events utilitizing software functions and a short-hand notation that describes these functions such that the short-hand notated functions are then translated into longer software functions. This disclosure describes numerous specific details that include specific structures, circuits, and logic functions in order to provide a thorough understanding of the present invention. One skilled in the art will appreciate that one may practice the present invention without these specific details.

Monitors and grids are used to evaluate the completeness of the simulation of a digital design such as a processor. More specifically, a monitor checks a design under simulation for specific verification events. If the monitor detects a specific event, it reports the information to a database. And, a grid is a monitor that detects a cross product of verification events and reports a single status event to a database. Additionally, a monitor language is used to create software monitors and grids, and may be translated into a standard computer language by a parser.

Figure 1:
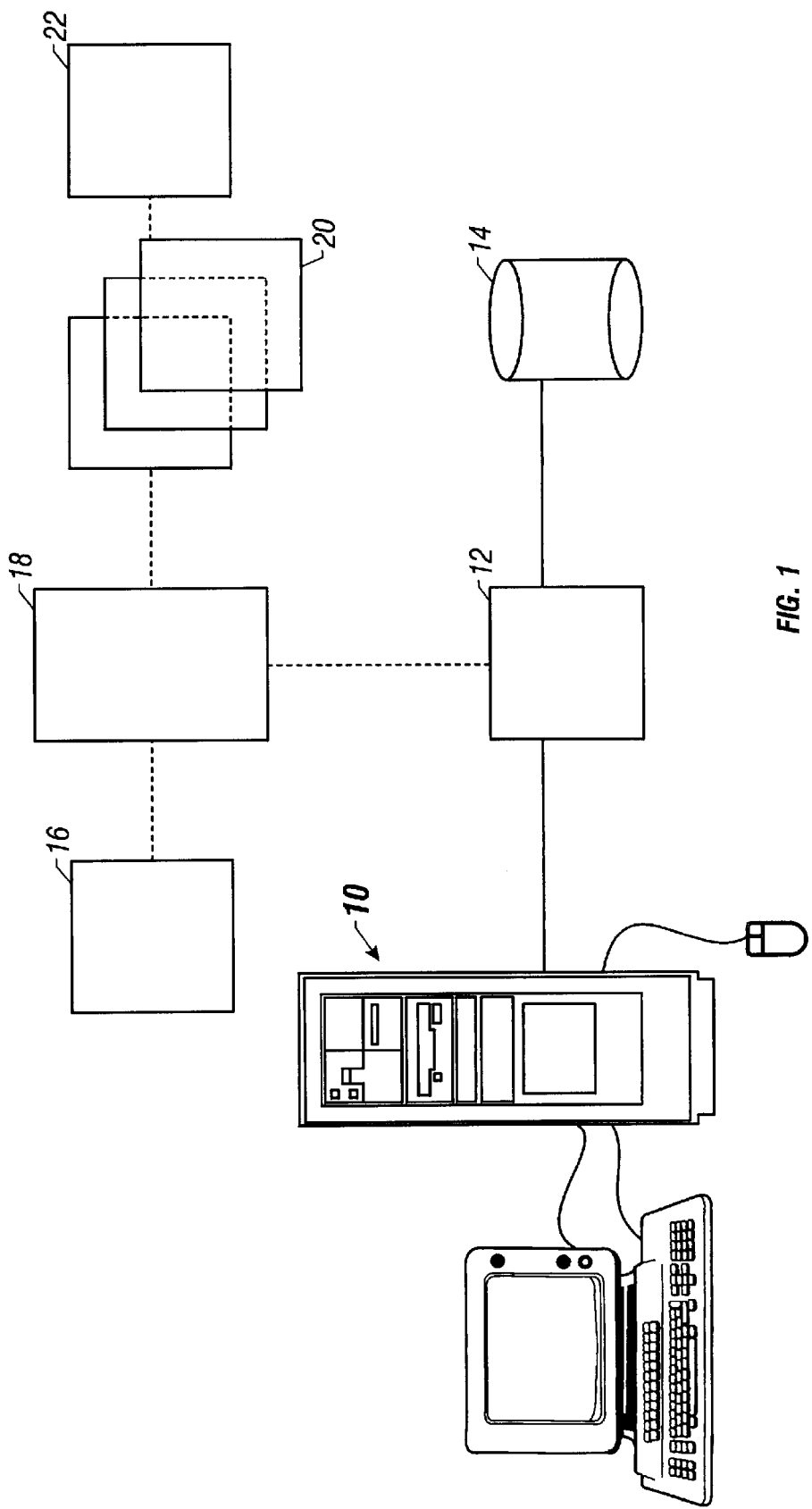
FIG. 1 is a system level description of the present invention.

FIG. 1 illustrates the present invention at a system level. A user at a workstation 10 runs a simulation. A workstation 10 is coupled to a server 12, which is in turn coupled to a shared storage device 14. A server 12 provides the facilities with which to run the simulation. When the simulation is run, one or more monitors and/or grids 20 run together with the simulator 18 and check the design 16 for a particular specified state. An individual monitor 20 detects and reports a status event to a database 22. An individual grid 20 detects multiple status events and reports a single status event to the database 22.

Monitors

Figures 2, 3:
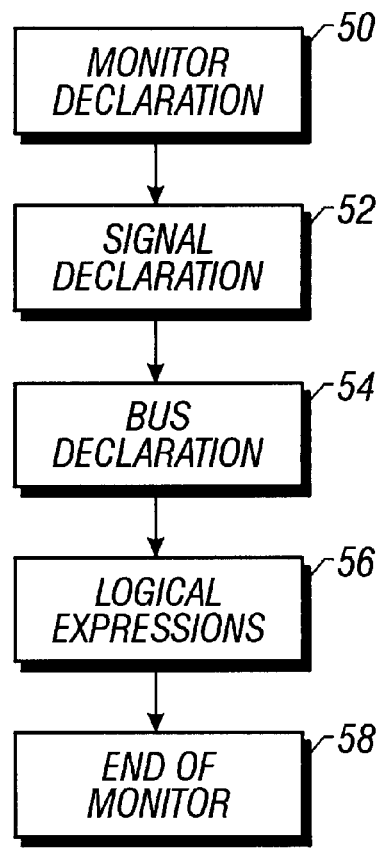
FIG. 2 illustrates the general organization of one embodiment of the present invention that comprises a monitor.
FIG. 3 is a diagram illustrating a cross product of events for a fully populated grid.

FIG. 2 illustrates the general organization of one embodiment of the present invention that comprises a monitor that detects and reports a status event to a database. The monitor comprises a monitor declaration 50, zero or more signal declarations 52, zero or more bus declarations 54, and one or more logic expressions 56. An example of a monitor constructed using the monitor language of the present invention is illustrated in Table 2:

TABLE 2

| | |
|---|---|
| monitor (ADD) { | // monitor declaration |
|    signal *val = "disp_valid_2h1"; | // signal declaration |
|    bus op = "disp_opcode_B[5:0,2]_4h1"; | // bus declaration |
|    if((*val == V1) && (bus_val(op) == 0x18)) | // logic expression |
|      return true; | |
| } | // end of monitor |

The first line is a monitor declaration, which defines the name of the monitor. The character string in parentheses is the name of the monitor, which must be unique among all monitors being executed because it will be used to store and retrieve the coverage information from the database. The second line is a signal declaration, which defines a variable name local to the monitor which is a pointer to a signal in the design. The character string in quotes is the full hierarchical name of the signal in the design. One embodiment of the present invention uses pointers such as used in C++ to access the values of a design signal such as the *val name; however, the present invention will operate with other methods of mapping a local variable name to a hierarchical design signal. (The present invention operates with both N-Nary and binary signals.) The third line is a bus declaration, which defines the name of a bus. A bus is a set of signals used to represent a single value. To use values of buses, the present invention declares a variable to be a bus rather than a set of signals. The character string in quotes is the full name of the bus; and subsequent references to the signal can use the op name. To get the value of the bus, the present invention uses a function that packs single bit values into a bus-sized variable, for example, bus_val( ). The following code fragments illustrate bus declarations:

bus data_h1="dl1.dl1_a_ldata_B[63:32,2]_4H5";
bus data_lo="dl1.dl1_a_ldata_B[31:0,2]_4H5";

The fourth line in Table 2 illustrates the use of the signal- and bus values in a logic expression. A logic expression is an expression that contains logical operators and operands and can be reduced to a value of true or false. The logic expression specifies the event that the monitor is evaluating. The monitor returns a true value when the specified event has occurred.

To use the monitor example in Table 2, the monitor code would be translated by the parser into a software routine such as a C++ function. The software routine would be compiled and dynamically or statically linked into the simulation environment. The simulation environment includes software to evaluate each monitor every cycle, to track how many times each monitor evaluated to true during a simulation, and to summarize that coverage information at the end of simulation. The coverage information is then logged in a database for future analysis. This approach to writing and using monitors provides an easy way to define functional verification events or design state events, provides an automated method to compile and link the code into the simulation, and provides an automated method to report the coverage results to a database.

Grids Interesting events in the test coverage of a digital design may often be described by taking a cross product of some combination of events. For example, one may want to test a digital design such as a processor for all combinations of two instructions running back-to-back. Another example is to test all possible combinations of external bus accesses. FIG. 3 is a diagram illustrating a fully populated cross product of events 90 for 3×3 cross product with-axis declarations:

axis(a)=a1, a2, a3;
axis(b)=b1, b2, b3;

Note that all cells of FIG. 3 are occupied, indicating that these axis declarations result in a fully populated cross product of events 90.

Figure 4:
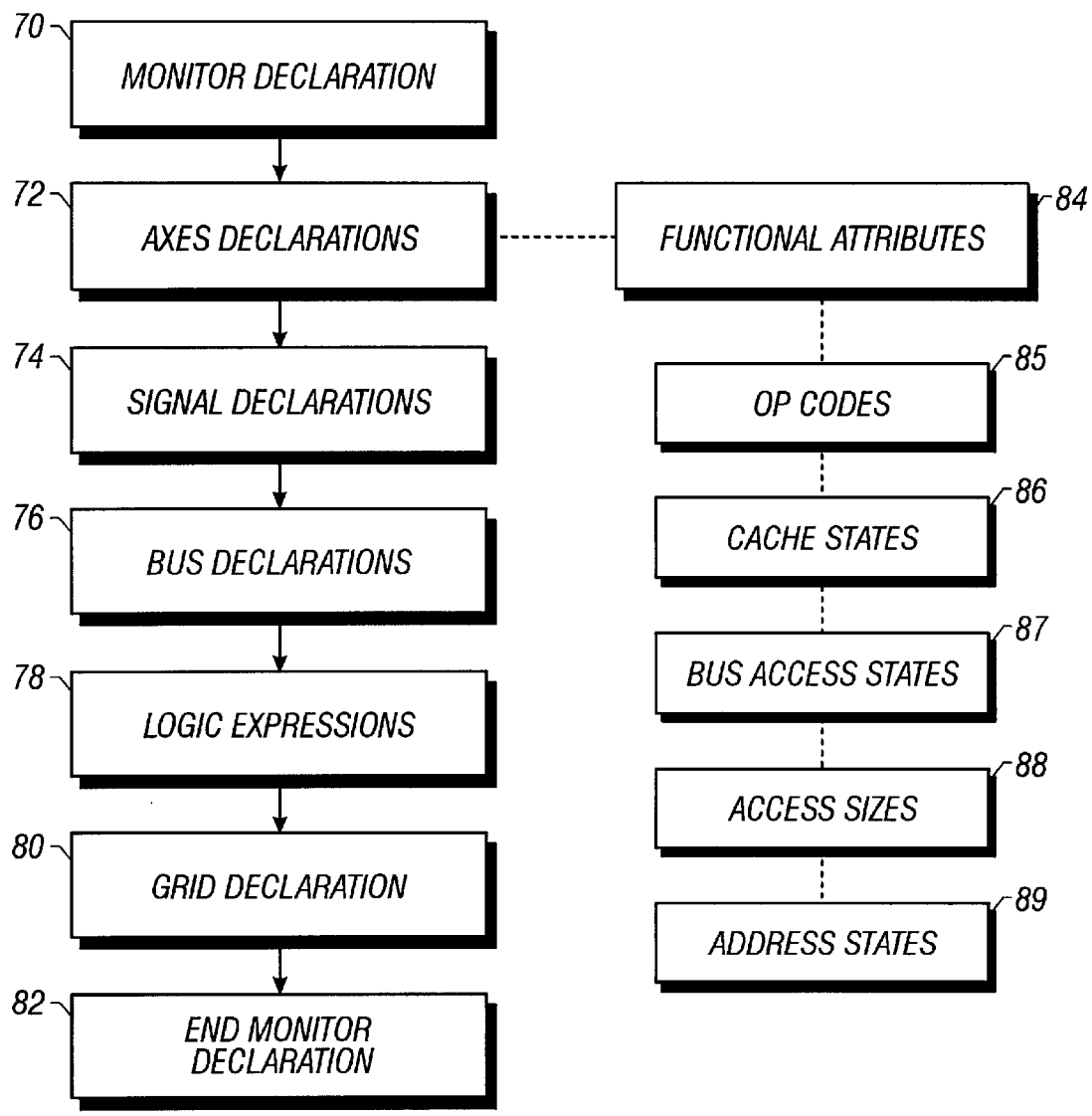
FIG. 4 illustrates the general organization of another embodiment of the present invention that comprises a grid.

The present invention defines a grid as a monitor that detects a cross product of multiple status verification events and reports a single status event to a database. A grid, as illustrated in FIG. 4, comprises a monitor declaration 70, axes declarations 72, zero or more signal declarations 74, zero or more bus declarations 76, one or more logic expressions 78, and a grid declaration 80. Similar to the monitor illustrated in Table 2, a monitor declaration 70 is the first line of the grid. Multiple axes declarations 72 are used to produce a cross product of verification events. A logic expression 78, formulated using the declared signals 74 and buses 76, is used to evaluate whether a specific verification event has occurred so that the grid can return a status event. And a grid declaration 80 returns the status event.

An individual axis declaration may comprise one or more possible functional states of a functional attribute 84 under test. Examples of functional attributes 84 may include an op code 85, a cache state 86, a bus access state 87, an access size 88, or an address state 89. An op code 85 may include a functional instruction like add, subtract, or multiply and the like, or a register instruction like load, store, and the like. A cache state 86 may include a dirty miss, a clean miss, a clean hit, a dirty hit, or a non-cacheable state. A bus access transaction 87 may include a simple request, a snoop, an invalidate, an emulation access, and or a block access (that can be a block read or a block write). An access size 88 may include 1 Kbyte size, a 2 Kbyte size, a 4 Kbyte size, or larger. And, an address state 89 may include address alignment issues such as boundary crossing or unaligned addresses.

The following example detects the states made by the cross product of add/subtract instructions with 2 operands that are classified as negative, zero, or positive. The cross product will be 2 (add/subtract)×3 (operand1: +, −, 0)×3 (operand2: +,−,0)=18 combinations. Using the present invention, only one software grid monitor has to be written and executed to detect that all 9 possible operand combinations were executed for both add and subtract functions. Assume that "disp_opcode_B[5:0,2]_4h1" is a signal in the digital design under test, and that if the signal has a value of 0, the operation is an add; and if the signal has a value of 1 the operation is a subtract. Since any value greater than 1 is not one of these instructions, the example monitor should not record any information for such a value. Also, assume that "disp_operand1_type" and "disp_operand2_type" are signals in the design and that they have values 0 for a negative operand, 1 for a zero operand, 2 for a positive operand, with values of 3 or greater not meeting the criteria that the monitor was trying to detect, so the monitor should not record any information for these values.

To declare an axis in a software grid monitor, an axis declaration 72 uses the axis keyword and lists the enumerated states for all the cases for that axis, as shown Table 3.

TABLE 3 axis(0) = ADD, SUB;
axis(1) = NEG1, ZERO1, POS1;
axis(2) = NEG2, ZERO2, POS2;

Note that any number of axes can be specified. Additionally, the number of states for each axes can be different, but each axis must have 1 or more enumerated states.

The current embodiment of the parser for the monitor language of the present invention generates software code such as C++ code that generates all possible permutations of events to create a unique name for each event based on the names of the enumerated states in the axis definitions. Alternatively, one could create a unique naming scheme for each event based on a method other than utilizing monitor and axis names. The database uses all of the unique state names for initialization purposes so that unique states that are not detected are still defined in the database to show that they were detected zero times. For the axis declarations in Table 3 (assuming the example monitor name is ARITH_INST), the event names are listed in Table 4.

TABLE 4

ARITH_INST.ADD_NEG1_NEG2,
ARITH_INST.ADD_NEG1_ZERO2,
ARITH_INST.ADD_NEG1_POS2,
ARITH_INST.ADD_ZERO1_NEG2,
ARITH_INST.ADD_ZERO1_ZERO2,
ARITH_INST.ADD_ZERO1_POS2,
ARITH_INST.ADD_POS1_NEG2,
ARITH_INST.ADD_POS1_ZERO2,
ARITH_INST.ADD_POS1_POS2,
ARITH_INST.ADD_POS1_POS2,
ARITH_INST.SUB_NEG1_NEG2,
ARITH_INST.SUB_NEG1_ZERO2,
ARITH_INST.SUB_NEG1_POS2,
ARITH_INST.SUB_ZERO1_NEG2,
ARITH_INST.SUB_ZERO1_ZERO2,
ARITH_INST.SUB_ZERO1_POS2,
ARITH_INST.SUB_POS1_NEG2,
ARITH_INST.SUB_POS1_ZERO2,
ARITH_INST.SUB_POS1_POS2

An enumerated type is then set up for the user so that variables can be declared and set to the names. These variables are called axis variables. For example, consider the axis declarations in Table 5.

TABLE 5 axis_0 instr; // axis_0 is an enumerated type with the values ADD=0, SUB=1
axis_1 operand_type1; // axis_1 is an enum. type with the values NEG1=0, ZERO1=1, POS1=2
axis_2 operand_type2;

In the body of the monitor, each axis variable is set to whatever is occurring on that axis. The signal declarations 74 and bus declarations 76 are described in the above section on monitors (see FIG. 2). Note that the signal of the signal declaration may be an N-Nary signal. Also, as in monitors generally, the logic expression 78 is the expression to be evaluated.

Once all axis variables have a legal value, the grid declaration 80 is used to identify the interesting events that have occurred. Grid_return is a construct for the monitor language that is used to support the logging of information for each unique cross product of events to create one state that can be communicated to the database for later analysis. For example, grid_return(instr,operand_type1,operand_type2);

Grid_return accepts a list of axis variables that it uses to construct a string that uniquely identifies the event that has occurred. If no list is provided to grid_return, then no interesting event was detected.

The following example in Table 6 is the full grid monitor code from which the examples in Tables 3, 4, and 5 were extracted.

TABLE 6

// monitor declaration
monitor (ARITH_INST) {
// set up the axes
axis(0) = ADD, SUB;
axis(1) = NEG1, ZERO1, POS1;
axis(2) = NEG2, ZERO2, POS2;
// declare axis variables of each enumerated type
axis_0 instr; // axis_0 is an enumerated type with the values ADD=0, SUB=1
axis_1 operand_type1; // axis_1 is an enum. type with the values NEG1=0, ZERO1=1, POS1=2

TABLE 6-continued axis_2 operand_type2;
// signal declaration section
bus opcode = "disp_opcode_B[5:0,2]4h1";
signal *operand1 = "disp_operand1_type_4h1";
signal *operand2 = "disp_operand2_type_4h1";
if (bus_val(opcode) == 0) instr = ADD;
else if (bus_val(opcode) == 1) instr = SUB;
else return false;   // no interesting instructions being executed, so stop now
if (*operand1 == V0) operand_type1 = NEG1;
else if (*operand1 == V1) operand_type1 = ZERO1;
else if (*operand1 == V2) operand_type1 = POS1;
else return false;
if (*operand2 == V0) operand_type2 = NEG2;
else if (*operand2 == V1) operand_type2 = ZERO2;
else if (*operand2 == V2) operand_type2 = POS2;
else return false;
// if the monitor has not exited by this point, the values for each axis variable
// should be set to legal values, so simply do a grid_return
grid_return(instr, operand_type1, operand_type2);
}

Sparse Grids

Figure 5:
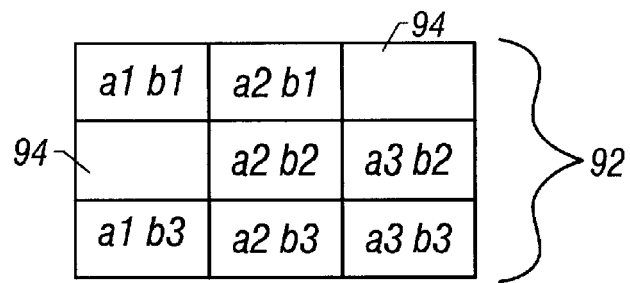
FIG. 5 is a diagram illustrating a cross product of events for a sparsely populated grid.

Although there are many uses for grids that do full cross products of events, there are frequently cases where some of the events in the full cross product are unnecessary or invalid within the context of the design being verified. FIG. 5 is a diagram illustrating a sparsely populated cross product of events 92 with the following axis declarations:

axis(a)=a1, a2, a3;
axis(b)=b1, b2, b3;

where a1 does not use b2, and a3 does not use b1. Note that some cells 94 in FIG. 5 are not occupied, which means that these axis declarations result in a sparsely populated cross product of events 92.

The monitor language of the present invention supports sparse grids to handle the above cases. To create a sparse grid, each event must be registered by calling the grid_register routine. Note that in the absence of any grid_register function calls, the parser of the present invention assumes a fully populated grid and creates the full cross product. Like grid_return, the grid_register function is called using axis variables as parameters.

The foreach construct (discussed in more detail below) can be used to simplify the process of registering events. To use foreach, an axis variable is declared, and the legal values for that axis are listed as is illustrated in Table 7.

TABLE 7 foreach (axis_0 instr = ADD, SUB) {
    grid_register(instr,NEG1,NEG2);
}

For the example above, the parser would iterate through the list of instructions and create events for ADD NEG1_NEG2 and SUB_NEG1_NEG2. In the case that all values of an axis are to be used, the axis variable can be set to "ALL" instead of listing all the cases. Note that the syntax for foreach varies from standard C++ in that the curly braces must be used even though there is only one line of code contained within them. Also, foreach is only intended to be used with grid_register.

To demonstrate a sparse grid, the previous grid example is expanded to report on the ABS instruction, which takes the absolute value of an operand. The new axis declarations for this example are listed in Table 8.

TABLE 8

```
axis(0) = ADD, SUB, ABS;
axis(1) = NEG1, ZERO1, POS1;
axis(2) = NEG2, ZERO2, POS2, NONE;
```

Note that the ABS instruction uses a single operand instead of two operands, so axis(2) now includes NONE as an attribute choice. Since ADD and SUB use two operands, and ABS only uses one operand, a sparse grid is required. The example code in Table 9 can be used to register the legal events.

TABLE 9

```
foreach (axis_0 instr = ADD, SUB) {
    foreach(axis_2 operand_type2 = NEG2, ZERO2, POS2) {
        grid_register(instr, ALL,operand_type2);
    }
}
grid_register(ABS, ALL, NONE);
```

The above example code would generate the list of events in Table 10 for this monitor.

TABLE 10

```
ARITH_INST2.ADD_NEG1_NEG2,
ARITH_INST2.ADD_NEG1_ZERO2,
ARITH_INST2.ADD_NEG1_POS2,
ARITH_INST2.ADD_ZERO1_NEG2,
ARITH_INST2.ADD_ZERO1_ZERO2,
ARITH_INST2.ADD_ZERO1_POS2,
ARITH_INST2.ADD_POS1_NEG2,
ARITH_INST2.ADD_POS1_ZERO2,
ARITH_INST2.ADD_POS1_POS2,
ARITH_INST2.SUB_NEG1_NEG2,
ARITH_INST2.SUB_NEG1_ZERO2,
ARITH_INST2.SUB_NEG1_POS2
ARITH_INST2.SUB_ZERO1_NEG2,
ARITH_INST2.SUB_ZERO1_ZERO2,
ARITH_INST2.SUB_ZERO1_POS2,
ARITH_INST2.SUB_POS1_NEG2,
ARITH_INST2.SUB_POS1_ZERO2,
ARITH_INST2.SUB_POS1_POS2
ARITH_INST2.ABS_NEG1_NONE,
ARITH_INST2.ABS_ZERO1_NONE,
ARITH_INST2.ABS._POS1_NONE
```

The example in Table 11 is the fill grid monitor code from which the examples in Tables 7, 8, 9, and 10 were extracted.

TABLE 11

```
monitor (ARITH_INST2) {
// set up the axes
axis(0) = ADD, SUB, ABS;
axis(1) = NEG1, ZERO1, POS1;
axis(2) = NEG2, ZERO2, POS2, NONE;
// declare axis variables of each enumerated type
axis_0 instr; // axis_0 is an enumerated type with the values ADD=0,
SUB=1
axis_1 operand_type1; // axis_1 is an enum. type with the values
NEG1=0, ZERO1=1, POS1=2
axis_2 operand_type2;
// signal declaration section
bus opcode = "disp_opcode_B[5:0,2]_4h1";
signal *operand1 = "disp_operand1_type_4h1";
signal *operand2 = "disp_operand2_type_4h1";
foreach (axis_0 instr = ADD, SUB) {
    foreach(axis_2 operand_type2 = NEG2, ZERO2, POS2) {
        grid_register(instr, ALL,operand_type2);
    }
}
```

TABLE 11-continued

```
grid_register(ABS, ALL, NONE);
if bus_val(opcode) == 0) instr = ADD;
else if (bus_val(opcode) == 1) instr = SUB;
else if (bus_val(opcode) == 2) instr = ABS;
else return false;
if (*operand1 == V0) operand_type1 = NEG1;
else if (*operand1 == V1) operand_type1 = ZERO1;
else if (*operand1 == V2) operand_type1 = POS1;
else return false;
if (instr == ABS) operand_type2 = NONE;
else {
    if (*operand2 == V0) operand_type2 = NEG2;
    else if (*operand2 == V1) operand_type2 = ZERO2;
    else if (*operand2 == V2) operand_type2 = POS2;
    else return false;
}
// if the monitor has not exited by this point, the values for each axis
// variable should be set to legal values, so simply do a grid_return
grid_return(instr, operand_type1, operand_type2);
}
```

Monitor Language

One goal of the present invention is to provide an easy method for a user to create a software monitor that detects and reports a status event to a database. Another secondary goal of the present invention is to define the language such that it is easy to convert the monitor language to a software language such as the C++ language. With these goals in mind, the monitor language of the present invention uses existing C++ constructs as an initial foundation, and adds a set of keywords that simplify the types of verification events that a monitor will need to examine.

Figure 6:
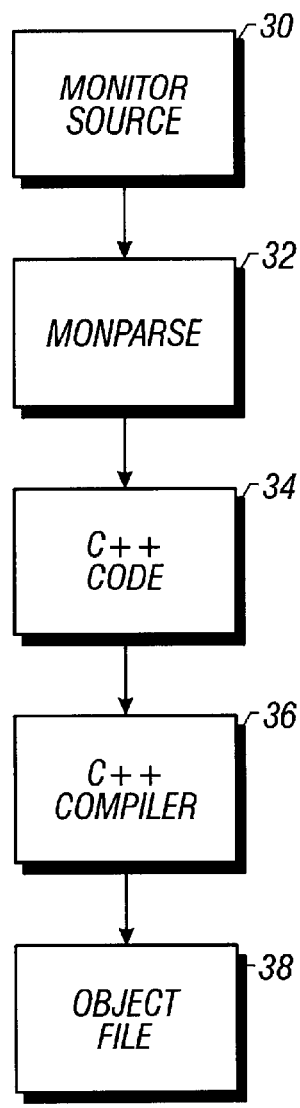
FIG. 6 is a flow chart illustrating the operation of a parser.

FIG. 6 is a flow chart illustrating the operation of a parser used in the present invention. A parser 32 (MonParse) may be used to translate the code in the monitor source file 30 into a code that uses a standard computer language. For example, the parser translates the code in the monitor source file into C++ code 34. A C++ compiler 36, in turn, translates the C++ code into an object code stored in an object file 38. MonParse 32 translates the keywords of the monitor language into C++ routines (functions) 34 that are executed by the simulator. In other words, the monitor language is a shorthand notation for numerous test routines, where each keyword is translated by the parser into many different routines.

The current embodiment of the present invention uses existing C++ constructs for logic expressions, loops, if/else statements and other housekeeping details. One embodiment of the present invention comprises the keywords listed in Table 12 for the monitor language. The examples throughout this document are intended primarily for illustration purposes.

TABLE 12 assert
signal
bus
bus_val
changeval
clock
consecutive
end_mon
expect
monitor
wait
axis
grid_return
ALL
foreach

TABLE 12-continued grid_register
V[0–20]

Null Value Representation.

The N-nary logic design style uses both 1-of-N signals and 0-or-1-of-N signals. The 1-of-N signal will, if it fails to evaluate, represent an invalid state. A 0-or-1-of-N signal is a signal driven by a cell that fails to evaluate for some legal input value. The 0-or-1-of-N signal will, if it fails to evaluate, represent a null value. This stems from the fact that, even for a value of zero, a 1-of-N signal must assert a positive voltage on one, and only one, wire of the N potential wires. Failure of a 0-or-1-of-N signal to assert a wire during an evaluation clock phase therefore results in a null value, rather than a value of zero.

The 0-or-1-of-N signals have a different value in the simulation environment than their logical value. This is because a signal value of NULL is represented as a '0' in the simulation environment, so a signal value of (logical) 0 must be represented as a '1'. Likewise, all other values are incremented by 1 for use in simulation. This is accounted for in the digital design by using #DEFINEs when setting and comparing values for null value signals. One embodiment of the present invention follows this practice. Most designs use "V0" to mean logical 0, so the use of V[0–20] within the monitor code will automatically be translated to the correct value during simulation. Table 13 shows the translation as follows:

TABLE 13

| Logical Value | Simulation Value | How to Reference |
| --- | --- | --- |
| NULL | 0 | 0 |
| 0 | 1 | V0 |
| 1 | 2 | V1 |
| 2 | 3 | V2 |
| 3 | 4 | V3 |

Assert

An assert statement is used to check whether a logic expression is true. If an expression is true, execution of the monitor continues. If false, execution is halted and an error condition is flagged. The user has the option of terminating the execution of the monitor or continuing. The format of an assert statement is:

assert ((<lexpr>), bool char *, . . . );

where the first argument, <lexpr>, is the logic expression to be evaluated. The second argument, bool, is a boolean value that specifies whether or not the evaluation is to be terminated. The third argument, char * (with the appropriate extra arguments), is the string to be printed as the error message. For example, consider the following monitor in Table 14, which flags an error any time an illegal opcode is dispatched as valid:

TABLE 14

```
monitor (DIV0) {
    bus opcode = "disp_opcode_B[5:0,2]_4h1";
    signal *val = "disp_valid_2h1";
    assert(((*val != V0) && (bus_val(opcode) != 0x38)),
        false, "Illegal opcode (%x) being dispatched as valid",
        bus_val(opcode));
}
```

If "disp_valid_2h1" has the value 1 and the bus op has the value 0x38, the following error message is printed: "error: Illegal opcode (op=0x38) being dispatched as valid".

Wait

It is frequently necessary to observe the design behavior over a period of multiple clock cycles to establish that a verification event of interest has occurred. To allow for this, a wait statement allows for the stalling of execution of the monitor until the proper condition is met. The simplest use of this is to wait until a defined number of clock cycles has elapsed. For example:

wait 50 clock;

stalls execution of the monitor until 50 clock cycles have elapsed. It is also valid to wait until a logic expression evaluates to true a defined number of times, not necessarily on consecutive clock cycles. For example:

wait 5 (*sig4==V1);

waits until sig4 equals 1 on five unique, but not necessarily consecutive, clock cycles. If it is only necessary to wait until a logic expression is true once, then the following is appropriate:

wait 1 (*sig4==V1);

The number of clock cycles to wait can be variable. For example:

int wlen;

if (*op==V3) wlen=4;

else wlen=1;

wait wlen clock;

waits 4 clock cycles if *op equals V3, otherwise it waits 1 clock cycle.

Expect

An expect statement provides a time window within which an expression is tested to be true. The general format of an EXPECT statement is:

expect t1, t2, (<lexpr>) {

// execute this block if true

} else {

// execute this block if not

} where t1, t2 are lower and upper time limits in clock cycles, and <lexpr> is the logic expression to be tested. Consider the monitor in Table 15, for example:

TABLE 15 expect t1, t2 (<lexpr>) ;
wait 2 clock;
. . .

If <lexpr> evaluates to true between clock cycle t1 and t2, the monitor continues execution. If <lexpr>does not evaluate to true between clock cycles t1 and t2, the monitor exits without triggering.

Changeval

A changeval statement causes the execution flow to enter a routine that returns true if the signal or logic expression within the parentheses has a different value than it had during the previous clock cycle. Since the value of the signal or logic expression is not sampled until the changeval is encountered, there will always be at least a one clock cycle delay between when the changeval is called and when it evaluates to true. Note that changeval does not return false for each cycle that the value remains the same. Table 16 includes several examples of changeval.

TABLE 16

| | |
|---|---|
| changeval(sig4); | // stalls the monitor until sig4 has a different value than //it did one clock cycle previously |
| changeval(sig4 \|\| sig7Y); | // stalls the monitor until the logical OR of // sig4 and sig7Y changes value |
| changeval(sig4) \|\| changeval(sig7Y); | //Waits until sig4 changes value, // and then waits for sig7Y to // change value. |

Consecutive

A consecutive statement provides an easy way to specify a sequence of events. The user has the choice between specifying that the sequence of events should start now or ever. The events are defined within curly braces, and there is the option of specifying that an event should happen multiple times. The generic format of consecutive is:

consecutive(now/ever, [x] {<lexpr>}, [x] {<lexpr>} . . . );

where now or ever designates when the sequence of events starts, x is the number of times the event should occur, and <lexpr> is the expression to be evaluated. The following example in Table 17 will trigger any time there is an add (opcode of 0), two subtracts (opcode of 1), and an add on consecutive clock cycles.

TABLE 17

```
monitor (ADD_SUB2_ADD) {
    bus opcode = "disp_opcode_B[5:0,2]_4h1";
    consecutive(now, {bus_val(opcode) == 0}, 2{bus_val(opcode) ==
    1},{bus_val(opcode) == 0});
    return true;
}
```

The monitor starts whenever the opcode equals 0, indicating an add instruction. On the following clock cycle, the second event on the list is evaluated. If it evaluates true, then the monitor stays alive and waits a clock cycle to evaluate the next event. If an event evaluates as false, then the monitor exits. This is where the now option differs from the ever one. If ever had been specified, the monitor would return to the beginning of the event list instead of exiting (resulting in a monitor that would trigger if that sequence of events ever occurred).

To summarize, the present invention comprises a method and apparatus for a monitor that detects and reports a status event to a database. A monitor checks a digital design for specific verification events; if the monitor detects a specified event, it reports the information to a database. The monitor comprises a monitor declaration, zero or more signal declarations, zero or more bus declarations, and one or more logic expressions. A monitor declaration defines the name of the monitor. A logic expression, formulated using the declared signals and buses, is used to evaluate whether a specific verification event has occurred. The present invention further comprises an apparatus and method that reports events to a database through a monitor where the signal of the signal declaration of the monitor is an N-Nary signal. In 1-of-N encoding, N wires are used to indicate one of N possible values. In addition, the present invention further comprises a parser to translate the code in the monitor source file into a code that uses a standard computer language such as C++. The parser translates the keywords of the monitor language into C++ routines (functions) that are executed by the simulator. Finally, the present invention further comprises a monitor where if the monitor detects the specific event for which it was looking, the monitor reports this information to a database.

Additionally, the present invention comprises a monitor language that verifies a digital design using a plurality of keywords. A keyword is a shorthand notation for one or more routines constructed in a standard programming language. A parser translates the monitor language into a standard programming language. The monitor language comprises groups of instructions, including a group of logic expressions, a group of declarations, e.g., bus and signal declarations, and a group comprising the functional language of the keywords.

Additionally, the present invention comprises a method and apparatus that reports design verification events with a single monitor. A grid is a monitor that detects a cross product of design verification events and reports a single status event to a database. A grid comprises a monitor declaration, one or more axis declarations, zero or more signal declarations, zero or more bus declarations, one or more logic expressions, and a grid declaration. A monitor declaration defines the name of the monitor. An axis declaration defines the valid states for a functional attribute under test. If two or more axis declarations are declared, the multiple axes are used to produce a cross product of verification events. A logic expression, formulated using the declared signals and buses, is used to evaluate whether a specific verification event has occurred so that the grid can return a status event. A grid return returns the status event. The present invention further comprises embodiments where a grid uses a cross-product of verification events that comprises a fully populated cross-product of verification events or a sparsely populated cross-product of verification events.

Other embodiments of the invention will be apparent to those skilled in the art after considering this specification or practicing the disclosed invention. The specification and examples above are exemplary only, with the true scope of the invention being indicated by the following claims.

We claim the following invention:

1. A monitor comprising software instructions, which when executed by a computer, causes the computer to detect a design verification event and reports a status event to a database, comprising:

a monitor declaration;

zero or more signal declarations wherein an individual signal declaration describes a signal having a signal name;

zero or more bus declarations wherein said bus declaration defines a bus that further comprises a set of signals that represents a single value determined by packing single bit values into a multibit variable;

one or more logic expressions that the monitor uses to evaluate whether the design verification event has occurred so that the monitor can return a status event; and wherein the signal is an N-Nary signal.

2. The monitor of claim 1 wherein the monitor reports the status event to a database.

3. The monitor of claim 1 further comprising a parser that translates the monitor into code that uses a standard computer language.

4. The monitor of claim 1 further comprising one or more computers that execute the code of the monitor.

5. A system that uses a monitor comprising software instructions, which when executed by a computer, causes the computer to detect a design verification event and reports a status event to a database, comprising:

a monitor declaration;

zero or more signal declarations wherein an individual signal declaration describes a signal having a signal name;

zero or more bus declarations wherein said bus declaration defines a bus that further comprises a set of signals that represents a single value determined by packing single bit values into a multibit variable;

one or more logic expressions that the monitor uses to evaluate whether the design verification event has occurred so that the monitor can return a status event; and wherein the signal is an N-Nary signal.

6. The system of claim 5 wherein the monitor reports the status event to a database.

7. The system of claim 5 further comprising a parser that translates the monitor into code that uses a standard computer language.

8. The system of claim 5 further comprising one or more computers that execute the code of the monitor.

9. A method that uses a monitor comprising software instructions, which when executed by a computer, causes the computer to detect a design verification event and reports a status event to a database, comprising:

providing a monitor declaration;

providing zero or more signal declarations wherein an individual signal declaration describes a signal having a signal name;

providing zero or more bus declarations wherein said bus declaration defines a bus that further comprises a set of signals that represents a single value determined by packing single bit values into a multibit variable;

providing one or more logic expressions;

evaluating said logic expressions to detect the design verification event so that the monitor can return a status event; and wherein the signal is an N-Nary signal.

10. The method of claim 9 wherein the monitor reports the status event to a database.

11. The method of claim 9 further comprising a parser that translates the monitor into code that uses a standard computer language.

12. The method of claim 9 further comprising one or more computers that execute the code of the monitor.

13. A program storage device readable by a machine, tangibly embodying a program of instructions executable by the machine to perform a method that uses a monitor comprising software instructions, which when executed by a computer, causes the computer to detect a design verification event and reports a status event to a database, comprising:

providing a monitor declaration;

providing zero or more signal declarations wherein an individual signal declaration describes a signal having a signal name;

providing one zero or more bus declarations wherein said bus declaration defines a bus that further comprises a set of signals that represents a single value determined by packing single bit values into a multibit variable;

providing one or more logic expressions;

evaluating said logic expressions to detect the design verification, event so that the monitor can return a status event; and wherein the signal is an N-Nary signal.

14. The program storage device of claim 13 wherein the monitor reports the status event to a database.

15. The program storage device of claim 13 further comprising a parser that translates the monitor into code that uses a standard computer language.

16. The program storage device of claim 13 further comprising one or more computers that execute the code of the monitor.

17. A method that provides a monitor comprising software instructions, which when executed by a computer causes the computer to detect a design verification event and reports a status event to a database, comprising:

providing a monitor declaration;

providing zero or more signal declarations wherein an individual signal declaration describes a signal having a signal name;

providing zero or more bus declarations wherein said bus declaration defines a bus that further comprises a set of signals that represents a single value determined by packing single bit values into a multibit variable;

providing one or more logic expressions that the monitor uses to evaluate whether the design verification event has occurred so that the monitor can return a status event; and wherein said signal is an N-Nary signal.

18. The method of claim 17 wherein the monitor reports the status event to a database.

19. The method of claim 17 further comprising a parser that translates the monitor into code that uses a standard computer language.

20. The method of claim 17 further comprising one or more computers that execute the code of the monitor.

* * * * *